United States Patent [19]
Takeuchi et al.

[11] Patent Number: 4,814,304
[45] Date of Patent: Mar. 21, 1989

[54] CERAMIC COMPOSITION FOR DIELECTRICS

[75] Inventors: Yukihisa Takeuchi, Nagoya; Hideo Masumori, Anjo, both of Japan

[73] Assignee: NGK Insulators, Ltd., Aichi, Japan

[21] Appl. No.: 911,389

[22] Filed: Sep. 25, 1986

[30] Foreign Application Priority Data

Sep. 28, 1985 [JP] Japan ................................ 60-215761

[51] Int. Cl.$^4$ ................................................. C03C 8/24
[52] U.S. Cl. ........................................ 501/15; 501/17; 501/20; 501/73; 501/79; 264/61; 428/901
[58] Field of Search ................ 501/20, 17, 15, 73, 501/79; 264/61; 428/901

[56] References Cited

U.S. PATENT DOCUMENTS 4,649,125 3/1987 Takeuchi et al. .................... 501/17

Primary Examiner—William R. Dixon, Jr.
Assistant Examiner—Anthony Green
Attorney, Agent, or Firm—Parkhurst, Oliff & Berridge

[57] ABSTRACT

A ceramic composition for an electronic circuit board, a hybrid integrated circuit, an integrated circuit package or a multilayer ceramic structure, consisting essentially of at least one electrically insulating glass, at least one organic binder, at least one inorganic peroxide, and at least one material selected from the group which consists of: a metal selected from the platinum group; a compound of the platinum group; a manganese oxide; and a cobalt oxide.

30 Claims, No Drawings

CERAMIC COMPOSITION FOR DIELECTRICS

BACKGROUND OF THE INVENTION

1. Field of the Invention

The present invention relates in general to a ceramic composition for dielectric materials used as dielectric ceramic pastes or green sheets for forming electronic circuit boards, hybrid integrated circuits, integrated circuit packages, and multilayer ceramic structures. More particularly, the invention is concerned with such a ceramic composition for dielectrics, which is suitably fired in a non-oxidizing atmosphere.

2. Discussion of the Prior Art

In the art of fabrication of various ceramic circuit boards, in particular, multiple-layered ceramic circuit boards, there is known a method in which conductor patterns are screen-printed on a ceramic green body of a dielectric material, by using a conductor paste which contains, as a major component thereof, a noble metal such as gold, silver, platinum or their alloys, which is stable in an oxidizing atmosphere. The ceramic green body and the printed conductor patterns or circuits of the noble metal paste are then co-fired in the oxidizing atmosphere. Thus, a ceramic circuit board is obtained. Another method is known, wherein the conductor pattern is formed of a conductor paste whose major component is a non-noble or base metal such as copper, nickel or tungsten. In this method, a non-oxidizing atmosphere is used for firing the ceramic green body and the conductor paste.

The former method of fabricating a ceramic circuit board is advantageous in that the co-firing of the ceramic green body and the printed conductor pattern can be effected in air. However, this method can be practiced only at a high cost due to the use of gold, silver and other noble metals that are considerably expensive. Thus, the method suffers from a drawback in terms of manufacturing economy. On the other hand, the latter method which uses base metals as a conductor is advantageous in the material cost. However, the method has some deleterious drawbacks in the quality of the end product. Described more specifically, the firing operation in this latter method is carried out in a non-oxidizing atmosphere, and therefore an organic binder used as a component of a dielectric ceramic composition is not sufficiently decomposed in the non-oxidizing atmosphere. That is, the organic binder may be left in the form of carbon, whereby the obtained ceramic circuit board tends to have blackened surfaces, pin holes and blisters, and are liable to suffer from insufficient sintering and deterioration of electrical properties.

As described above, the known dielectric ceramic compositions with base metal conductors have problems of low rate of burnout or removal of an organic binder, and low degree of sinterability. In view of these problems, it is considred very difficult to commercially practice the above-indicated method wherein a ceramic circuit board is fabricated by co-firing the ceramic dielectric composition containing a glass component, and a base metal conductor, in a non-oxidizing atmosphere.

However, efforts have been made to overcome the above-indicated problems or drawbacks associated with the technologies of co-firing a dielectric ceramic composition with a conductor of non-noble or base metal. For example, various ceramic compositions for dielectrics have been proposed, which include: a ceramic composition containing crystallizable glass; a ceramic composition containing a relatively large amount of alumina, zirconia or other refractory filler which is mixed with a glass component; a ceramic composition containing an oxide of high valence metal such as $PrO_2$; and a ceramic composition containing an organic binder which is thermally decomposable at a low temperature. However, these proposed compositions have not satisfactorily eliminated the drawbacks experienced in the prior art.

SUMMARY OF THE INVENTION

It is accordingly a primary object of the present invention to provide an improved ceramic composition for dielectrics suitable for electronic circuit boards, hybrid integrated circuits, integrated circuit packages, or multiple-layered ceramic structures, which is usable as a dielectric paste for screen printing, or as a material for green sheets, and which is improved in removal of an organic binder, adhesion to a conductor, electrical properties and sinterability.

Another object of the invention is the provision of such an improved ceramic composition which has substantially no residual carbon and which exhibits excellent electrical properties even when the composition is fired in a non-oxidizing atmosphere wherein an organic binder is usually difficult to be burned out.

These objects of the invention can be achieved by the present invention which provides a ceramic composition consisting essentially of at least one electrically insulating glass, at least one organic binder, at least one inorganic peroxide, and at least one material selected from the group consisting of: a metal selected from the platinum group; a compound of the platinum group; a manganese oxide; and a cobalt oxide.

The ceramic composition of the invention is characterized by the inclusion of (a) at least one inorganic peroxide, and (b) at least one material selected from the group consisting of: a metal selected from the platinum group; a compound of the platinum group; a manganese oxide; and a cobalt oxide. The presence of such at least one inorganic peroxide, and an oxide of cobalt, a metal of the platinum group, or other element or elements selected from the group identified above, permits effective removal or burnout of the organic binder contained in the ceramic composition, thereby drastically reducing the amount of residual carbon left in the fired composition, even when the composition is fired in a non-oxidizing atmosphere. Accordingly, the ceramic composition of the present invention provides a solution to the problems encountered in the prior art, i.e., eliminates surface blackening, development of pin holes and blisters of the obtained electronic circuit boards, multilayer ceramic structures or the like, as previously pointed out. Stated differently, the ceramic composition prepared according to the invention is significantly enhanced in adhesion to a conductor, sinterability, and electronic properties.

DETAILED DESCRIPTION OF THE INVENTION

The inorganic peroxide used according to the invention is an inorganic peroxide or peroxy acid having an $O_2$ group of two negative charges. It is assumed that the chemical feature of the peroxide is attributed to the $O_2$ group in a molecule, and that this $O_2$ group serves to decompose and remove an organic binder in the composition during sintering of the composition in a non-oxidizing atmosphere, and enhances the sinterability of the ceramic composition.

This inorganic peroxide is selected from peroxides of alkali metal, from peroxides of metal in group II of the periodic table, or from peroxides of heavy metal including copper peroxide, titanium peroxide, cerium peroxide and chromium peroxide. Preferably, the inorganic peroxide is selected from the group consisting of calcium peroxide, strontium peroxide, barium peroxide, zinc peroxide and cadmium peroxide. In this group, the use of calcium or strontium peroxide is particularly preferred. Further, it is desirable that such an inorganic peroxide used according to the invention be present in the dielectrics or dielectric product, in the form of an oxide, glass or other compound after the composition of the invention has been fired.

The amount of the inorganic peroxide to be contained in the ceramic composition of the invention is suitably selected depending upon the kind and amount of an organic binder to be used. Generally, the inorganic peroxide is added, preferably in an amount of 0.1-40% by weight of the ceramic composition. In the case where the content of the inorganic peroxide is excessively low or not more than the lower limit of 0.1%, a sufficiently high degree of binder removal capability is not expected. On the other hand, the use of the inorganic peroxide in an amount exceeding the upper limit of 40% by weight will prevent the ceramic composition from becoming a sufficiently dense structure, or cause similar defciencies. As a rule, the inorganic peroxide is used in the form of a powder, preferably of an average particle size in a range of about 0.5-10 microns, from the standpoint of sinterability of the composition.

It is noted that the use of an organic peroxide in place of an inorganic peroxide does not permit perfect removal of a carbon component adhering to a glass component, upon firing of a dielectric ceramic composition in a non-oxidizing atmosphere. In this case, therefore, a portion of the carbon component remains in the fired ceramic composition, causing the previously indicated drawbacks, e.g., development of blisters on the surface of a conductor which is co-fired with the ceramic composition. Although the total replacement of the inorganic peroxide by an organic peroxide is not desired for the above reason, it is possible to use such an organic peroxide in addition to an inorganic peroxide which should be included in an amount in the range specified above.

The at least one material selected from the group consisting of the metal of the platinum group, the compound of the platinum group, the manganese oxide, and the cobalt oxide, is used according to the invention for the purpose of enhancing the efficiency of removal the organic binder by at least one inorganic peroxide as described above. It is assumed that the at least one material (hereinafter referred to as "catalytic substance") selected from the above group acts as a catalyst which aids the inorganic peroxide or peroxides in reacting with the organic binder. The amount of this catalytic substance is preferably within a range of 0.01-10% by weight. The removal of the organic binder may be insufficient below the lower limit of 0.01%, while the density of the fired dielectric ceramic composition may be unsatisfactory above the upper limit of 10%. More preferably, the catalytic substance is used within a range between 0.1% and 3%.

The catalytic substance is preferably selected from the group consisting of Pt, Pd, Pt-Rh, $Co_3O_4$, CoO, PdO and $MnO_2$. These catalytic substance or substances may be included as a component or components of the insulating glass contained in the ceramic composition of the invention.

The compounds of the platinum group usable as the catalytic substance include: chloroplatinic acid; chloropalladic acid; tetrammine platinum (II) nitrate; tetrammine platinum (II) chloride; platinum hydroxide; ruthenium hydroxide; palladium nitrate; platinum chloride; dicarbonyl bis(triphenyl phosphine) platinum; iodotrimethyl platinum; dichloro ($\eta$-1, 5-cyclooctadiene) platinum; and dodecacarbonyl tri-ruthenium.

The electrically insulating glass used according to the invention is preferably that which interacts with the specific inorganic peroxide indicated above, to improve the degree of sintering of the ceramic composition. More specifically, it is preferred to use: various kinds of silicate glass; silicate glass which includes at least one of $Al_2O_3$, $B_2O_3$, MgO, PbO, BaO, ZnO, $Li_2O$, $TiO_2$, CaO, $ZrO_2$, and other components; or crystallizable glass which is crystallized through heat treatment thereof. One preferred composition of such crystallizable insulating glass consists essentially of $SiO_2$, $Al_2O_3$, CaO, ZnO and $TiO_2$. Another preferred composition of the glass consists essentially of $SiO_2$, MgO, BaO, $B_2O_3$ and ZnO. A further preferred composition of the glass consists essentially of $SiO_2$, $Al_2O_3$, PbO and CaO. A still further preferred composition of the glass consists essentially of $SiO_2$, $Al_2O_3$, CaO, $B_2O_3$ and MgO. A yet further preferred composition of the glass consists essentially of $SiO_2$, $B_2O_3$, PbO and CaO. More preferably, the composition of the insulating glass contains ZnO or PbO. In general, glasses are liable to be denatured in a reducing atmosphere. In the ceramic composition according to the present invention, however, an inorganic peroxide included in the composition serves to protect the insulating glass from denaturation. This indicates that the particular kind of firing atmosphere does not limit the composition of the insulating glass that may be included in the ceramic composition of the invention.

The organic binder, which is a component of the ceramic composition of the invention, can be selected from any binders commonly used in known dielectric ceramic compositions. For example, the ceramic composition of the present invention may contain commonly used binders which alternatively comprise: ethyl cellulose; polyvinyl butyral resins; polyethylene resins; polystyrene resins; polyvinyl alcohol resins; acrylic resins; methacrylic resins; or acrylate-methacrylate copolymers. Among the binders listed above, polymeric binders comprising one of the following are particularly preferred: acrylic resins; methacrylic resins; and acrylate-methacrylate copolymers. The amount of the organic binder to be included in the inorganic dielectric material is generally within a range of 0.5% to 30% by weight of the ceramic composition of the invention, preferably 3% to 20%.

The inorganic dielectric material, which includes the above-mentioned insulating glass and organic binder, may further include a filler of refractory material such as alumina, zirconia, silica, mullite and cordierite, alone or in combination, and/or an additive of an oxide such as zinc oxide, praseodymium oxide and bismuth oxide, alone or in combination. The amount or amounts of the refractory filler and/or the oxide additive is/are determined so as to attain an intended degree of sinterability of the ceramic composition. In normal conditions, the ratio of weight percent of the insulating glass to the refractory filler and/or the oxide additive is held within a range of above 90/10 to 5/95.

As previously indicated, the ceramic composition for dielectrics of the invention, which has been described, may be employed as dielectric ceramic pastes or green sheet materials for electronic circuit boards, hybrid integrated circuits, integrated circuit packages or multilayer ceramic structures. When the ceramic composition of the invention is used as a dielectric ceramic paste, a suitable vehicle such as acetone, terpineol, methyle carbitol and butyl caribitol acetate is added to the ceramic composition to prepare a paste for printing. A desired number of dielectric (insulating) and conductor layers are alternately printed, using the prepared dielectric ceramic printing paste, and a conductor paste of base metal which consists of at least one of Cu, Ni, Cr, W and Mo as its major component(s) and the balance essentially of a glass component and an organic binder. If necessary, resistor layers are also printed with a resistor paste containing $LaB_6$, NiCr, TaN, $SrRuO_4$, etc. This resistor paste may be replaced by a resistor paste whose major component is a mixture of Ru oxides, glass and inorganic peroxide, or by a resistor paste normally used in this field. Described more specifically, at least one dielectric layer and at least one conductor layer are printed on an alumina ceramic substrate or on a green sheet of ceramic material, such that the dielectric and conductor layers are alternately superposed by printing in desired patterns. Each of the printed conductor layers define a conductor circuit pattern. Thus, an unfired printed laminar structure of a ceramic circuit board is prepared. Then, the unfired printed laminar structure is co-fired in a non-oxidizing atmosphere, for example, at a temperature of 500°–1200° C. Thus the end product is fabricated. That is, the dielectric layers formed from the dielectric paste prepared from the present ceramic composition are fired concurrently. This is contrary to the traditional method using the known dielectric printing paste, wherein the article under fabrication should be fired in a non-oxidizing atmosphere each time a layer has been printed with a base metal paste or dielectric paste according to a commonly practiced method, so called "printed lamination technology" or "thick film multilayer technology".

It will be obvious that the dielectric paste prepared from the instant ceramic composition of the invention may be used even in the case where a firing operation in a non-oxidizing atmosphere is carried out each time a layer has been printed with a dielectric paste and a base metal paste.

In the case where the ceramic composition of the present invention is used as a material for a green sheet, a slip or slurry is prepared by adding to the ceramic composition at least one known suitable solvent such as trichloroethylene, toluene-ethyl acetate, xylene, acetone, alcohol and benzene, and if necessary, at least one known suitable plasticizer such as dibutyl phthalate, and at least one known suitable peptizer such as menhaden oil and trioleic acid glyceryl ester (triolein). Subsequently, the prepared slurry is cast into a ceramic green sheet of uniform thickness ranging from 50 to 700 microns, in a conventional doctor-blading process. A desired base metal paste is printed in a predetermined pattern to form a conductor circuit on the prepared green sheet. A desired number of the printed green sheets are stacked and laminated at an elevated temperature under a suitable pressure. Thus, an unfired laminar green sheet structure is prepared. The unfired laminar structure having the conductor circuit pattern layers are then co-fired at a suitable temperature (as indicated above) in a non-oxidizing atmosphere. Thus, an intended electronic circuit board is fabricated.

The non-oxidizing atmosphere in which the ceramic dielectric composition of the invention is suitably fired, is interpreted to mean an atmosphere which does not oxidize, to a substantial extent, the base metal conductor which is used with the instant composition, and whose major component consists of at least one of Cu, Ni, Cr, W and Mo. Generally, the firing operation is achieved in a nitrogen atmosphere, in a mixture gas of nitrogen and hydrogen, or in a $H_2+N_2+H_2O$ gas (mixture of nitrogen and hydrogen gases and water vapor). It is noted that the firing atmosphere need not be held constant in nature throughout a firing process of the ceramic composition. For instance, the ceramic composition of the invention may be satisfactorily fired even if the firing atmosphere varies in oxygen concentration due to variation in temperature.

It is further noted that the ceramic composition of the invention may be suitably employed in the case where a multilayer ceramic structure using a known ceramic composition encounters difficulty in burnout or removal of an organic binder during a firing process even in air. In such instance, the use of the instant ceramic composition facilitates the organic binder removal and minimizes the residual carbon which is otherwise left in a larger amount within the multilayer ceramic structure.

To further clarify the principle of the present invention, the following examples are given. However, it is to be understood that these examples should not be construed to limit the scope of the invention. Unless otherwise stated, quantities appearing in the examples are expressed as percent by weight.

EXAMPLES

Crystallizable glass comprising $SiO_2$, $Al_2O_3$, CaO, ZnO and $TiO_2$ was wet-ground to an average particle size of 5 microns, while alumina as a refractory filler was wet-ground to an average particle size of 2 microns. Calcium peroxide ($CaO_2$) as an inorganic peroxide was dry-ground to an average particle size of 1 micron. Then, 85% of the crystallizable glass as an insulating glass, 10% of the alumina, 4.5% of the calcium peroxide ($CaO_2$), and 0.5% of $Co_3O_4$ as a catalytic substance were mixed with each other, and blended for two hours to give a homogeneous powder mixture of glass and ceramics.

An organic binder in the form of an acrylic binder solution (XSA-1256 available from MITSUI TOATSU CHEMICALS, INC.) was added to the thus prepared glass-ceramic powder mixture, such that the acrylic binder was present in the glass-ceramic powder mixture in an amount of 5%. In this manner, a dielectric ceramic composition of the invention was obtained as Example 1. The ceramic composition of Example 1 is indicated in Table 1.

In the same manner as used in preparing the above ceramic composition of Example 1, ceramic compositions were prepared as Examples 2–12 by mixing insulating glass and alumina, inorganic peroxide, catalytic substance and organic binder, as specified in Table 1.

In Examples 8 and 9, the insulating glass contains CoO as a catalytic substance. The content of CoO in each of these compositions is 0.3%.

For the purpose of examining the thus obtained Examples 1-12 of Table 1 in terms of effects of the inorganic peroxides and catalytic substance contained therein, dielectric pastes and green sheets were prepared using these Examples 1-12, according to a commonly practiced method. The dielectric pastes of Examples 1-10 were used, together with an ordinary conductor paste, to print on an alumina ceramic substrate two conductor layers each having a 17-micron thickness and one dielectric layer having a 50-micron thickness, with the dielectric layer sandwiched between the two conductor layers, in order to produce an unfired printed laminar structure according to a known method, so called "thick film multilayer technology". Further, each of the ceramic compositions of Examples 11 and 12 was used to prepare a set of ten green sheets each having a 300-micron thickness. Conductor layers were printed in predetermined circuit patterns on the respective ten green sheets of each set, so that each conductor layer has a 17-micron thickness. These green sheets were stacked and laminated to produce an unfired laminar sheet structure. Each of the unfired printed laminar structures of Examples 1 12 was fired in a nitrogen atmosphere containing 20 ppm of oxygen. That is, the conductor layers and the dielectric layers of each unfired structures were co-fired in the nitrogen atmosphere. Thus, the ceramic circuit boards corresponding to Examples 1-12 were obtained. These ceramic circuit boards were tested to check for the amounts of residual carbon, development of blisters, resistivity, and adhesion strength of the conductor layer. The results are indicted in Table 2. In the fabrication of the above ceramic circuit boards, the conductor pastes used were prepared from a base metal whose primary component consists of Cu, Ni or W.

insulating glass, organic binder, inorganic peroxide and catalytic substance, exhibit higher degrees of burnout or removal of the organic binder, sinterability and adhesion to a base metal conductor even with the co-firing operation effected in a non-oxidizing atmosphere, than the ceramic compositions which do not include an inorganic peroxide (Examples 7, 10 and 12), or which include an inorganic peroxide but does not include a catalytic sustance (Example 6). With respect to the reduction in the residual carbon, it was found that the catalytic substance acted to enhance the effect of the $O_2$ group of the inorganic peroxide to remove the organic binder, facilitating the decomposition of the organic binder, and thereby preventing a carbon content from being left sticking to the insulating glass and alumina.

Further, high sintering results of the present ceramic compositions according to the invention even in the case of firing in a non-oxidizing atmosphere, are considered to stem from an effect of reaction between the insulating glass and the inorganic peroxide, and from an effect of the $O_2$ group of the inorganic peroxide to prevent denaturatrion or change in property of the insulating glass under the non-oxidizing atmosphere, as well as from the effect of the $O_2$ group to reduce the residual carbon. These effects of the inorganic peroxide used according to the invention are synergistically improved by the catalytic substance used according to the principle of the invention. Thus, the catalytic substance included in a ceramic composition in addition to an inorganic peroxide will permit improved sinterability of the ceramic composition, enhanced resistivity and other excellent electrical properties of the fired product obtained from the composition.

As described hitherto, the dielectric ceramic composition according to the invention can be used for dielectric printing pastes or green sheets which are excellent in removal of an organic binder contained therein, and in sintering results, even if the composition is co-fired with a base metal paste, in a non-oxidizing atmosphere. The dielectric pastes or green sheets based on the instant ceramic composition are fired into dielectric structures which are improved in electrical properties. Hence, the present invention provides a ceramic composition which may be widely used for the production of various hybrid integrated circuits boards, integrated circuit packages, and multilayer ceramic structures, as well as electronic circuit boards having a single or a plurality of conductor layers formed of a base metal.

What is claimed as new and desired to be secured by Letters Patent of the United States, is:

TABLE 1

| Example No. | Glass Composition | Inorganic Peroxide | Catalytic Substance | Proportion (%) Glass | Peroxide | Catalytic Substance | Alumina Filler | Conductor Metal |
|---|---|---|---|---|---|---|---|---|
| 1 | $SiO_2$—$Al_2O_3$—$CaO$—$ZnO$—$TiO_2$ | $CaO_2$ | $Co_2O_4$ | 85 | 4.5 | 0.5 | 10 | Cu |
| 2 | | $SrO_2$ | CoO | 80 | 0.5 | 4.0 | 15.5 | Cu |
| 3 | | $SrO_2$ | Pt | 85 | 8 | 0.2 | 6.8 | Ni |
| 4 | | $CaO_2$ | $MnO_2$ | 60 | 30 | 10 | 0 | Cu |
| 5 | | $CaO_2 + SrO_2$ | Pd | 70 | 20 | 5 | 5 | Cu |
| 6 | | $SrO_2$ | — | 80 | 0.5 | — | 19.5 | Cu |
| 7 | | — | — | 90 | 0 | — | 10 | Cu |
| 8 | $SiO_2$—$Al_2O_3$—$PbO$—$B_2O_3$—$CaO$—$CoO$ | $CaO_2$ | (CoO) | 80 | 10 | (0.3) | 10 | Cu |
| 9 | | $SrO_2$ | (CoO) | 85 | 5 | (0.3) | 10 | Ni |
| 10 | $SiO_2$—$Al_2O_3$—$PbO$—$B_2O_3$—$CaO$ | — | — | 80 | — | — | 20 | Cu |
| 11 | $SiO_2$—$Al_2O_3$—$PbO$—$B_2O_3$—$CaO$ | $SrO_2$ | $Co_3O_4$ | 40 | 10 | 5 | 45 | Cu |
| 12 | | — | — | 50 | — | — | 50 | Ni |

TABLE 2

| Example No. | Residual Carbon (%) | Blister | Resistivity ($\Omega \cdot cm$) | Adhesion Strength of Conductor Layer ($kg/mm^2$) |
|---|---|---|---|---|
| 1 | <0.01 | NO | $4 \times 10^{15}$ | >4 |
| 2 | <0.01 | NO | $1 \times 10^{15}$ | >4 |
| 3 | <0.01 | NO | $1 \times 10^{15}$ | >4 |
| 4 | <0.01 | NO | $1 \times 10^{15}$ | >4 |
| 5 | <0.01 | NO | $9 \times 10^{14}$ | >4 |
| 6 | 0.01 | NO | $5 \times 10^{14}$ | 3 |
| 7 | 0.4 | YES | $2 \times 10^{8}$ | <1 |
| 8 | <0.01 | NO | $3 \times 10^{15}$ | >4 |
| 9 | <0.01 | NO | $2 \times 10^{15}$ | >4 |
| 10 | 0.3 | YES | $9 \times 10^{8}$ | <1 |
| 11 | <0.01 | NO | $5 \times 10^{15}$ | >4 |
| 12 | 0.5 | YES | $3 \times 10^{10}$ | 1 |

As is apparent from Tables 1 and 2, the dielectric ceramic compositions of the invention which contain an 1. A ceramic composition for an electronic circuit board, a hybrid integrated circuit, an integrated circuit package or a multilayer ceramic structure, consisting essentially of:
   at least one electrically insulating glass;
   at least one organic binder;
   at least 0.1% by weight of at least one inorganic peroxide; and
   at least 0.01% by weight of at least one material selected from the group consisting of: a metal selected from the platinum group; a compound of the platinum group; and a manganese oxide.

2. The ceramic composition of claim 1, wherein said at least one material is present in an amount by weight of 0.01–10%.

3. The ceramic composition of claim 1, wherein said at least one material is selected from the group consisting of Pt, Pd, Pt-Rh, PdO and $MnO_2$.

4. The ceramic composition of claim 1, wherein said compound of the platinum group is selected from the group consisting of chloroplatinic acid; chloropalladic acid; tetrammine platinum (II) nitrate; tetrammine platinum (II) chloride; platinum hydroxide; ruthenium hydroxide; palladium nitrate; platinum chloride; dicarbonyl bis(triphenyl phosphine) platinum; iodotrimethyl platinum; dichloro ($\eta$-1, 5-cyclooctadiene) platinum; and dodecacarbonyl tri-ruthenium.

5. The ceramic composition of claim 1, wherein said at least one inorganic peroxide is present in an amount by weight of 0.1–40%.

6. The ceramic composition of claim 1, wherein said at least one inorganic peroxide is selected from the group consisting of peroxides of alkali metals, peroxides of group II elements of the Periodic Table and peroxides of heavy metals.

7. The ceramic composition of claim 6, wherein said at least one inorganic peroxide is selected from the group consisting of calcium peroxide, strontium peroxide, barium peroxide, zinc peroxide and cadmium peroxide.

8. The ceramic composition of claim 7, wherein said at least one inorganic peroxide is present in an amount by weight of 0.1–40%.

9. The ceramic composition of claim 7, wherein said at least one inorganic peroxide is selected from the group consisting of calcium peroxide and strontium peroxide in an amount by weight of 0.01–40%.

10. The ceramic composition of claim 1, wherein said at least one insulating glass is selected from the group of glasses consisting of: a silicate glass consisting essentially of $SiO_2$ and at least one component selected from the group consisting of $Al_2O_3$, $B_2O_3$, MgO, PbO, BaO, ZnO, $Li_2O$, $TiO_2$, CaO and $ZrO_2$ a crystallizable glass consisting essentially of $SiO_2$, CaO, ZnO and $TiO_2$; a crystallizable glass consisting essentially of $SiO_2$, MgO, BaO, $B_2O_3$, and ZnO; a crystallizable glass consisting essentially of $SiO_2$, $Al_2O_3$, PbO, and CaO; a crystallizable glass consisting essentially of $SiO_2$, $Al_2O_3$, CaO, $B_2O_3$, and MgO; and a crystallizable glass consisting essentially of $SiO_2$, $B_2O_3$, PbO and CaO, wherein each of said crystallizable glasses is crystallized through heat treatment thereof.

11. The ceramic composition of claim 1, wherein said at least one organic binder is selected from the group consisting of ethyl cellulose, polyvinyl butyral resins, polyethylene resins, polystyrene resins, polyvinyl alcohol resins, acrylic resins, methacrylic resins and acrylate-methacrylate copolymers.

12. The ceramic composition of claim 1, wherein said at least one organic binder is present in an amount by weight of 0.5–30%.

13. A ceramic composition for an electronic circuit board, a hybrid integrated circuit, an integrated circuit package or a multilayer ceramic structure, consisting essentially of:
   at least one electrically insulating glass;
   at least one component selected from the group consisting of refractory fillers and oxide additives;
   at least one organic binder;
   at least 0.1% by weight of at least one inorganic peroxide; and
   at least 0.01% by weight of at least one material selected from the group consisting of: a metal selected from the platinum group; a compound of the platinum group; and a manganese oxide.

14. The ceramic composition of claim 13, wherein said at least one material is present in an amount by weight of 0.01–10%.

15. The ceramic composition of claim 13, wherein said at least one material is selected from the group consisting of Pt, Pd, Pt-Rh, PdO and $MnO_2$.

16. The ceramic composition of claim 13, wherein said compound of the platinum group is selected from the group consisting of chloroplatinic acid; chloropalladic acid; tetrammine platinum (II) nitrate; tetrammine platinum (II) chloride; platinum hydroxide; ruthenium hydroxide; palladium nitrate; platinum chloride; dicarbonyl bis(triphenyl phosphine) platinum; iodotrimethyl platinum; dichloro ($\eta$-1, 5-cyclooctadiene) platinum; and dodecacarbonyl tri-ruthenium.

17. The ceramic composition of claim 13, wherein said at least one inorganic peroxide is present in an amount by weight of 0.1–40%.

18. The ceramic composition of claim 13, wherein said at least one inorganic peroxide is selected from the group consisting of peroxides of alkali metals, peroxides of group II elements of the Periodic Table and peroxides of heavy metals.

19. The ceramic composition of claim 18, wherein said at least one inorganic peroxide is selected from the group consisting of calcium peroxide, strontium peroxide, barium peroxide, zinc peroxide and cadmium peroxide.

20. The ceramic composition of claim 19, wherein said at least one inorganic peroxide is present in an amount by weight of 0.1–40%.

21. The ceramic composition of claim 19, wherein said at least one inorganic peroxide is selected from the group consisting of calcium peroxide and strontium peroxide in an amount by weight of 0.1–40%.

22. The ceramic composition of claim 13, wherein said at least one insulating glass is selected from the group of glasses consisting of: a silicate glass consisting essentially of $SiO_2$ and at least one component selected from the group consisting of $Al_2O_3$, $B_2O_3$, MgO, PbO, BaO, ZnO, $Li_2O$, $TiO_2$, CaO and $ZrO_2$; a crystallizable glass consisting essentially of $SiO_2$, $Al_2O_3$, CaO, ZnO and $TiO_2$; a crystallizable glass consisting essentially of $SiO_2$, MgO, BaO, $B_2O_3$, and ZnO; a crystallizable glass consisting essentially of $SiO_2$, $Al_2O_3$, PbO, and CaO; a crystallizable glass consisting essentially of $SiO_2$, $Al_2O_3$, CaO, $B_2O_3$, and MgO; and a crystallizable glass consisting essentially of $SiO_2$, $B_2O_3$, PbO and CaO, wherein each of said crystallizable glasses is crystallized through heat treatment thereof.

23. The ceramic composition of claim 13, wherein said at least one organic binder is selected from the group consisting of ethyl cellulose, polyvinyl butyral resins, polyethylene resins, polystyrene resins, polyvinyl alcohol resins, acrylic resins, methacrylic resins and acrylatemethacrylate copolymers.

24. The ceramic composition of claim 13, wherein said at least one organic binder is present in an amount by weight of 0.5-30%.

25. The ceramic composition of claim 13, wherein said at least one component is selected from the group consisting of alumina, zirconia, silica, mullite, cordierite, zinc oxide, praseodymium oxide and bismuth oxide.

26. The ceramic composition of claim 16, wherein a ratio of weight percent of said at least one electrically insulating glass and said at least one component is 90/10-5/95.

27. A ceramic composition for an electronic circuit board, a hybrid integrated circuit, an integrated circuit package or a multilayer ceramic structure, consisting essentially of:
   at least one electrically insulating glass;
   at least one organic binder;
   at least 0.1% by weight of at least one inorganic peroxide;
   a cobalt oxide; and
   at least 0.01% by weight of at least one material selected from the group consisting of: a metal selected from the platinum group; a compound of the platinum group; andd a manganese oxide.

28. A ceramic composition for an electronic circuit board, a hybrid integrated circuit, an integrated circuit package or a multilayer ceramic structure, consisting essentially of:
   at least one electrically insulating glass;
   at least one component selected from the group consisting of refractory fillers and oxide additives;
   at least one organic binder;
   at least 0.1% by weight of at least one inorganic peroxide;
   a cobalt oxide; and
   at least 0.01% by weight of at least one material selected from the group consisting of: a metal selected from the platinum group; a compound of the platinum group; and a manganese oxide.

29. The ceramic composition of claim 27, wherein said at least one material is selected from the group consisting of Pt, Pd, Pt-Rh, PdO and $MnO_2$, and said cobalt oxide is selected from the group consisting of $Co_3O_4$ and CoO.

30. The ceramic composition of claim 28, wherein said at least one material is selected from the group consisting of Pt, Pd, Pt-h, PdO and $MnO_2$, and said cobalt oxide is selected from the group consisting of $Co_3O_4$ and CoO.

* * * * *